United States Patent
Gambino et al.

(10) Patent No.: US 9,041,210 B2
(45) Date of Patent: May 26, 2015

(54) THROUGH SILICON VIA WAFER AND METHODS OF MANUFACTURING

(75) Inventors: Jeffrey P. Gambino, Westford, VT (US); Jessica A. Levy, Milton, VT (US); Cameron E. Luce, Essex Junction, VT (US); Daniel S. Vanslette, Fairfax, VT (US); Bucknell C. Webb, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 170 days.

(21) Appl. No.: 13/527,131

(22) Filed: Jun. 19, 2012

(65) Prior Publication Data

US 2013/0334701 A1 Dec. 19, 2013

(51) Int. Cl.
*H01L 23/48* (2006.01)
*H01L 21/768* (2006.01)

(52) U.S. Cl.
CPC ....... *H01L 23/481* (2013.01); *H01L 2924/0002* (2013.01); *H01L 21/76898* (2013.01)

(58) Field of Classification Search
USPC ............................ 257/637; 438/627–637, 674
See application file for complete search history.

(56) References Cited

U.S. PATENT DOCUMENTS

| | | | |
|---|---|---|---|
| 6,380,628 B2 | 4/2002 | Miller et al. | |
| 6,908,848 B2 | 6/2005 | Koo | |
| 7,494,916 B2 | 2/2009 | Hsu et al. | |
| 7,494,917 B2 | 2/2009 | Koo | |
| 7,709,369 B2 | 5/2010 | Lee et al. | |
| 7,843,072 B1 | 11/2010 | Park et al. | |
| 8,049,327 B2 | 11/2011 | Kuo et al. | |
| 2001/0019884 A1 | 9/2001 | Miller et al. | |
| 2003/0170974 A1* | 9/2003 | Sakata | 438/623 |
| 2006/0273465 A1* | 12/2006 | Tamura | 257/774 |
| 2007/0210365 A1* | 9/2007 | Togashi et al. | 257/296 |
| 2009/0166882 A1* | 7/2009 | Jeong | 257/774 |
| 2009/0184089 A1 | 7/2009 | Chebi et al. | |
| 2010/0052178 A1* | 3/2010 | Meinhold et al. | 257/773 |
| 2010/0055400 A1 | 3/2010 | Farr et al. | |
| 2010/0240212 A1* | 9/2010 | Takahashi | 438/637 |
| 2011/0018133 A1 | 1/2011 | Chaabouni et al. | |
| 2011/0221044 A1* | 9/2011 | Danek et al. | 257/621 |
| 2013/0224948 A1* | 8/2013 | Richter et al. | 438/653 |

OTHER PUBLICATIONS

A. Stamper et al. "Through Wafer Via Integration in CMOS and BiCMOS Technologies", IBM Microelectronics, 6 pages, 2008.
R. Malladi et al. "3D Integration Techniques Applied to SiGe Power Amplifiers", ECS Transactions, 16 (10), The Electrochemical Society, pp. 1053-1067, 2008.

* cited by examiner

*Primary Examiner* — David Hu
*Assistant Examiner* — Jonathan Han
(74) *Attorney, Agent, or Firm* — Anthony Canale; Roberts Mlotkowski Safran & Cole, P.C.

(57) ABSTRACT

A through silicon via with sidewall roughness and methods of manufacturing the same are disclosed. The method includes forming a via in a substrate and roughening a sidewall of the via by depositing material within the via. The method further includes removing a backside of the substrate to form a through via with a roughened sidewall structure.

11 Claims, 8 Drawing Sheets

THROUGH SILICON VIA WAFER AND METHODS OF MANUFACTURING

FIELD OF THE INVENTION

The invention relates to semiconductor structures and, more particularly, to a through silicon via with sidewall roughness and methods of manufacturing the same.

BACKGROUND

Through silicon vias (TSV) are used for a number of applications, including low inductance ground connections for RF devices. Typically, TSVs are filled with either tungsten or copper, which are electrically insulated from the substrate. In such processes, the substrate is insulated from the tungsten using a TiN liner, in order to avoid degradation of the silicon within the TSV. Degradation, of the silicon, is known to lead to cracking and reduced fracture strength of the substrate.

Tungsten filled TSVs have a number of advantages compared to copper filled TSVs. For example, tungsten can be deposited by chemical vapor deposition (CVD), so it is easy to fill high aspect ratio vias. However, a disadvantage of tungsten compared to copper is that the elastic modulus is high. The high elastic modulus, in turn, results in a higher stress in the silicon for tungsten filled TSV verses copper filled TSV. Hence there is a higher risk of wafer cracking and die cracking for tungsten filled TSV than copper filled TSV.

FIG. 1, for example, shows the fracture strength of wafers in different configurations. More specifically, FIG. 1 shows the fracture strength of a silicon wafer without a TSV, and during additional processes. For example, the fracture strength shown at point "A" is representative of a silicon wafer without a TSV. On the other hand, point "B" is representative of the fracture strength of the wafer with a TSV etched into the substrate. As shown, point "B" exhibits an approximate 50% reduction in strength compared to a silicon wafer without a TSV. Points "C", "D" and "E" represent the fracture strength of the wafer post fill with tungsten. Here, again, the fracture strength at points "C", "D" and "E" is lower than even point "B". The wafer again regains some strength after it is thinned, as shown at point "F". Although the wafer regains some fracture strength, it never exhibits the same strength as shown at point "A", and barely greater than that at point "B". Accordingly, it is shown in this graph that fracture strength is greatly reduced by having a TSV, and even further reduced by using conventional tungsten fill processes.

Accordingly, there exists a need in the art to overcome the deficiencies and limitations described hereinabove.

BRIEF SUMMARY

In an aspect of the invention, a method comprises forming a via in a substrate and roughening a sidewall of the via by depositing material within the via. The method further comprises removing a backside of the substrate to form a through via with a roughened sidewall structure.

In an aspect of the invention, a method comprises forming a resist pattern over a substrate. The resist pattern has a predetermined shape. The method further comprises etching a via in the substrate through the predetermined shape to form a roughened sidewall structure of the via corresponding to the predetermined shape. The method further comprises depositing material in the via. The method further comprises removing a backside of the substrate to form a through via with the roughened sidewall structure.

In another aspect of the invention, a structure comprises a through silicon via formed in a substrate, which includes roughened sidewalls and a metal deposited therein. The metal is exposed at a backside of the substrate to contact a metallization layer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the through silicon via wafer of the present invention. In still further embodiments, a method in a computer-aided design system is provided for generating a functional design model of the through silicon via wafer. The method comprises generating a functional representation of the through silicon via wafer of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to a through silicon via with sidewall roughness and methods of manufacturing the same. In embodiments, the sidewall roughness of the through silicon via (TSV) improves the fracture strength of the through silicon via (TSV) wafer. For example, the roughened sidewall of the TSV improves adhesion of metal to the silicon, which is formed in the TSV. The improved adhesion, in turn, increases the energetic barrier for crack growth (i.e., a higher stress is required for a crack to grow), resulting in improved fracture strength. In turn, the improved adhesion and resulting fracture strength also improves process yield during wafer fabrication and packaging.

In embodiments, the sidewall roughness can be achieved by, for example, roughening the sidewall of the TSV using chemical deposition processes. For example, the sidewall roughness can be formed by using a chemical vapor deposition process, with a $WF_6$ chemistry. In further embodiments, the sidewall roughness can be formed with certain resist shapes or hemi-spherical grain deposition processes, which form bumps or divots within the TSV.

Figure 1:
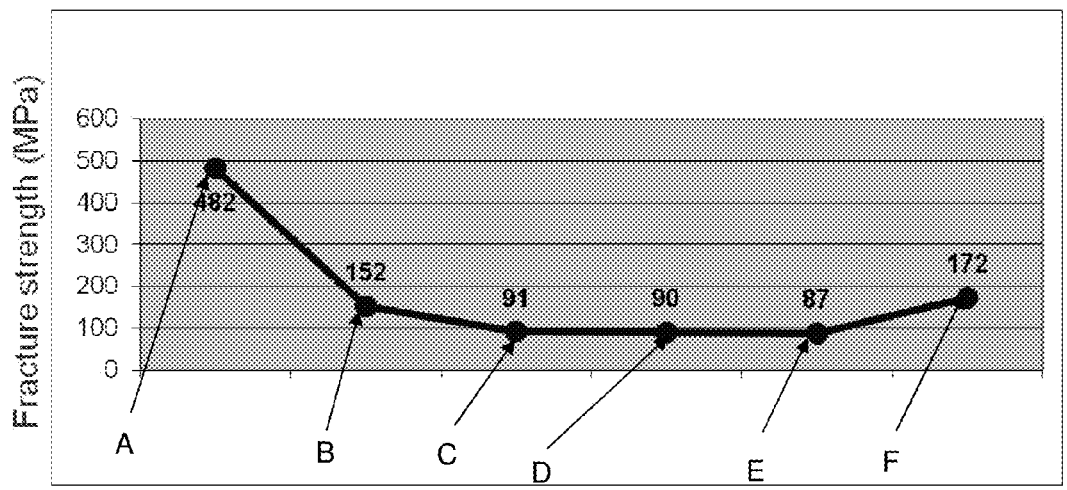
FIG. 1 shows a graph of wafer fracture strength in a conventional through silicon via.
Figure 2:
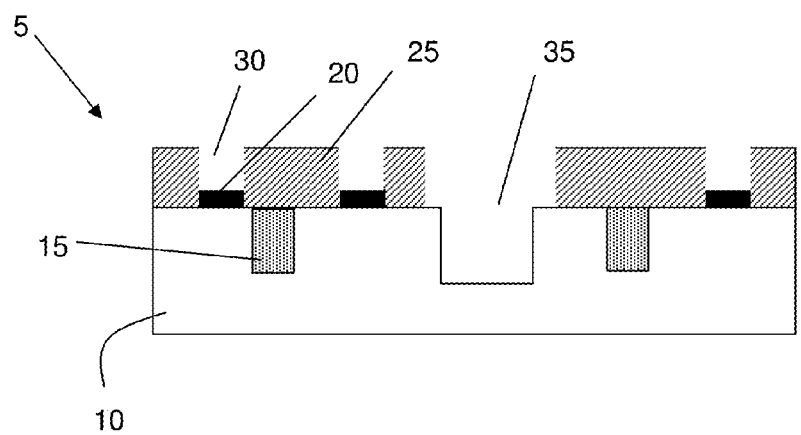
FIGS. 2-5 show processing steps and respective structures in accordance with aspects of the present invention.

FIG. 2 shows processing steps and a respective intermediate structure in accordance with aspects of the present invention. In particular, the structure 5 includes a substrate 10. In embodiments, the substrate 10 can be any semiconductor substrate such as, for example, silicon (Si), SiGe, Gallium Arsenide (GaAs), etc. In embodiments, shallow trench isolation (STI) structures 15 are formed in the substrate 10, between active or passive devices 20. In embodiments, the STI structures 15 can be formed from oxide, using conventional lithography, etching and deposition processes. For example, a resist can be formed on the substrate 10, and exposed to light to form a pattern (openings). A reactive ion etching (RIE) can then be performed to form trenches in the substrate 10. The trenches can then be filled with insulator material, e.g., oxide, using conventional deposition processes, e.g., chemical vapor deposition (CVD). The devices 20 can then be formed on the substrate 10 using conventional processes. The devices 20 can be, for example, field effect transistors (FETs), bipolar transistors, etc., all formed using conventional processes.

Still referring to FIG. 2, a dielectric material 25 can be formed over the substrate 10, including the STI structures 15 and the devices 20. The dielectric material 25 can be any contact dielectric material such as, for example, oxide or other insulator materials. The dielectric material 25 can be formed using conventional deposition processes, e.g., CVD. In embodiments, the dielectric material 25 can be planarized using conventional processes. Vias 30 can be formed in the dielectric material 25, to expose one or more of the devices 20. In embodiments, the vias 30 are formed using conventional lithography and etching (RIB) processes. By masking the devices 20, a via (e.g., through via) 35 can be formed in the substrate 10 using lithography and etching (RIE) processes.

In embodiments, the etching process for formation of the via 35 is a Bosch process, (also known as pulsed or time-multiplexed etching). In embodiments, the dielectric material 25 and the substrate 10 can be separately etched to form the via 35, using a two step masking process. In further embodiments, the via 35 can be formed by an alternating and repeated standard, nearly isotropic plasma etch using, e.g., $SF_6$, followed by deposition of a chemically inert passivation layer, e.g., $C_4F_8$ (Octafluorocyclobutane). In embodiments, the via 35 can be to formed to a depth of greater than 5 microns, as one example. For example, the via can be about 150 microns in depth. After formation of the via 35, the mask can then be removed using, e.g., conventional oxygen ashing techniques.

Figure 3:
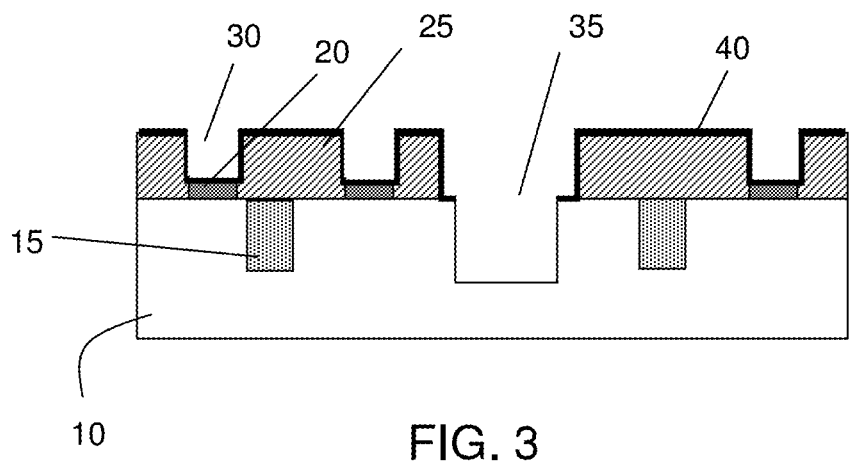

In FIG. 3, a liner 40 is formed over exposed surfaces of the dielectric material 25 and exposed devices 20. For example, the liner 40 can be formed in the vias 30, over the devices 20 and on a surface of the dielectric material 25. In embodiments, the liner 40 is formed by sputter deposition techniques. In this way, the liner 40 will not be formed within the via 35 (at least below a few microns deep). In embodiments, the liner 40 is titanium, titanium tungsten (TiW) or alloys thereof, or TiN, to name a few materials. The liner 40 can have a thickness of about 10 nm to about 50 nm; although, other thicknesses are also contemplated by the present invention.

Figure 4:
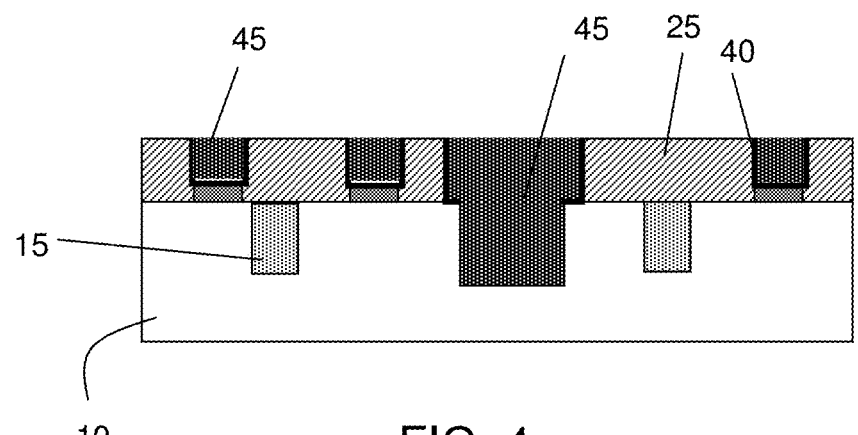
Figure 6A:
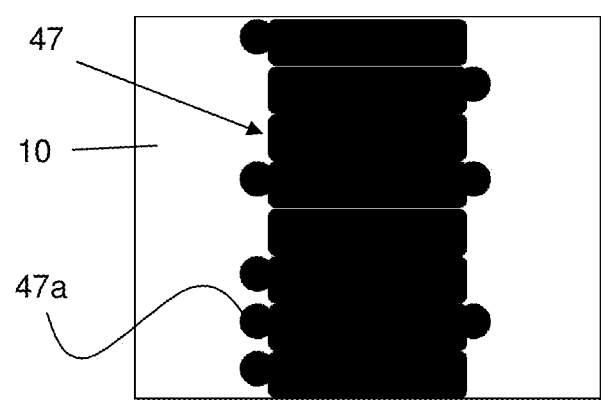
FIGS. 6a-6j show various configurations of roughness, i.e., rough sidewalls of a through silicon via (TSV), in accordance with aspects of the present invention.

In FIG. 4, the vias 30 and via 35 are simultaneously filled with material 45 in accordance with aspects of the present invention. In the deposition processes, the sidewalls of the via 35 will become roughened due to the specific deposition processes being implemented; whereas, the liner 40 will protect the sidewalls of the vias 30 during such deposition processes. By way of example, the sidewalls of the via 35 can be roughened as shown in FIG. 6a.

In specific embodiments, the vias 30 and via 35 are filled with tungsten using a CVD process. In more specific embodiments, the tungsten is deposited using a CVD process with a $WF_6$ chemistry. As the via 35 has exposed surfaces (e.g., silicon surfaces), the fluorine will attack the sidewalls of the via 35, resulting in a roughening of the sidewalls (roughened sidewall). In contrast, the liner 40 provided within the vias 30 will act as an adhesion/barrier layer to protect the underlying Si from attack by fluorine. In embodiments, the liner 40 can be removed from a top surface of the dielectric material 25 with any residual material (material 45) after the deposition process, using conventional chemical mechanical polishing (CMP) processes.

The sidewall roughness of the via 35 will improve the fracture strength of the through silicon via (TSV) wafer. Specifically, the roughened sidewall improves adhesion of the material 45 to the substrate 10. The improved adhesion, in turn, increases the energetic barrier for crack growth (i.e., a higher stress is required for a crack to grow), resulting in improved fracture strength and hence improved process yield during wafer fabrication and packaging.

Figure 5:
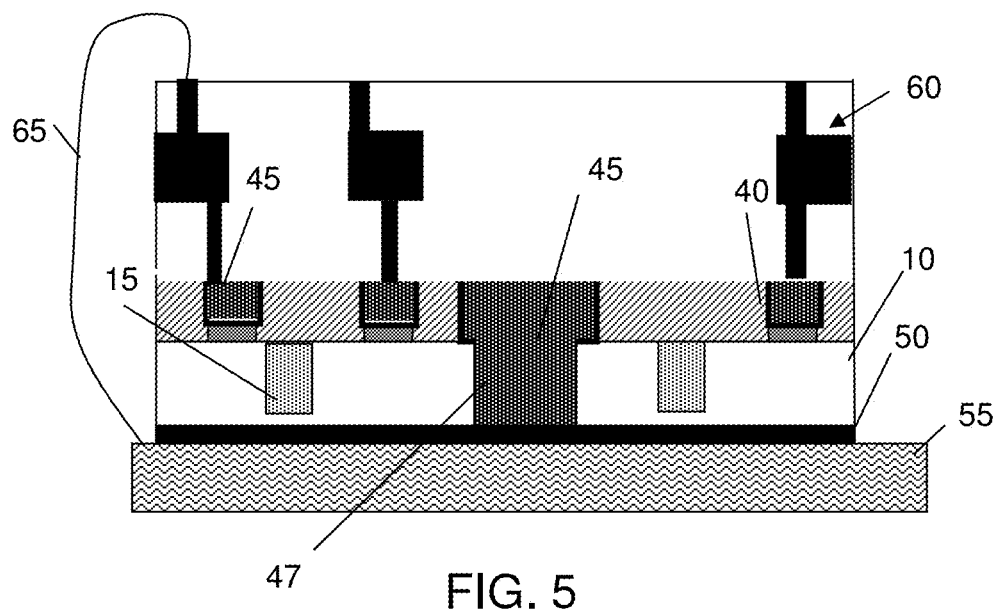

FIG. 5 shows additional processing steps and a respective structure, in accordance with aspects of the present invention. As shown in FIG. 5, the backside of the substrate (wafer) 10 undergoes a grinding or other removal process to expose the material 45 within the via 35 (now formed as a through silicon via (TSV) 47). A metallization 50 is formed on the backside of the substrate 10, in contact with the TSV 47. The die is attached to a substrate 55 using a conductive adhesive, that forms an electrical connection to the metallization 50. Moreover, using conventional processes, additional structures, devices, and/or metallization layers can be formed over dielectric layer 25, generally shown at reference numeral 60. A wire 65 can be connected between the substrate 55 and a device/structure 60.

FIGS. 6a-6j show various configurations of roughness, i.e., rough sidewalls of the TSV 47. For example, FIG. 6a shows a general pattern of roughness 47a, which can be of a random configuration. The roughness 47a can be formed using the processes described with respect to FIGS. 2-5.

Alternatively, the roughness (features) shown in FIGS. 6b-6j can be formed by manipulating the pattern of a photoresist 70, used to form the via 35. In embodiments, the roughness 47a can be implemented in combination with any of the shapes shown in FIGS. 6b-6j. Alternatively, the roughness (features) shown in FIGS. 6b-6j can be implemented independent of the processes shown in FIGS. 2-5. As such, as should be understood by those of skill in the art, the via 35 formed with the configurations shown in FIGS. 6b-6j can be implemented with or without the liner 40 being provided within the via 35.

Figure 6B:
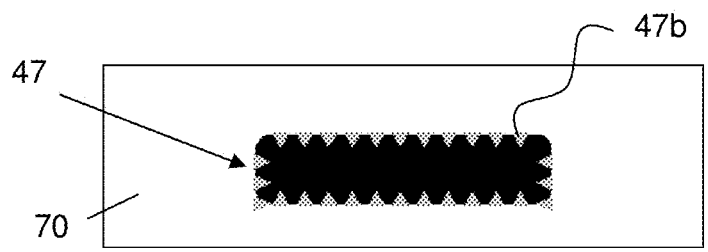
Figure 6C:
Figure 6D:
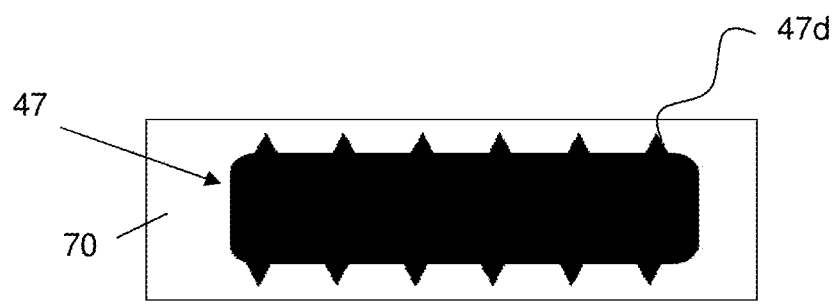
Figure 6E:
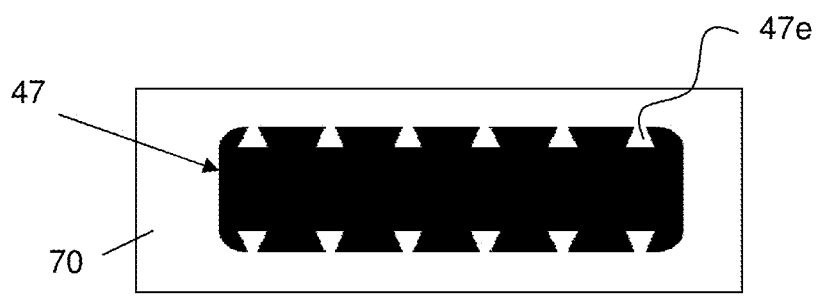
Figure 6F:
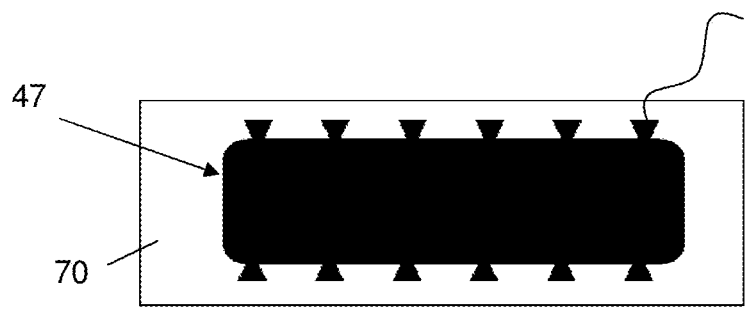
Figure 6G:
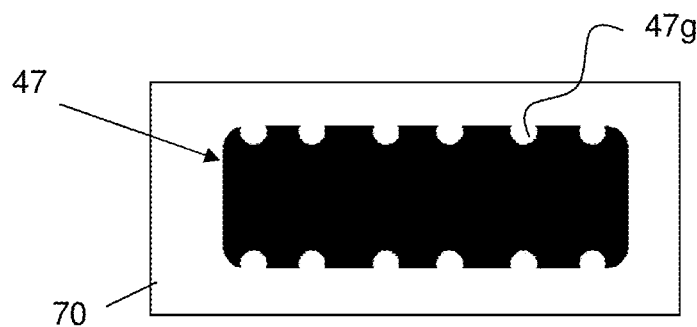
Figure 6H:
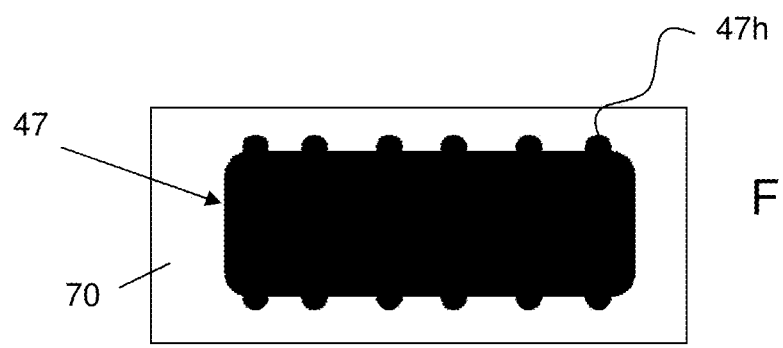
Figure 6I:
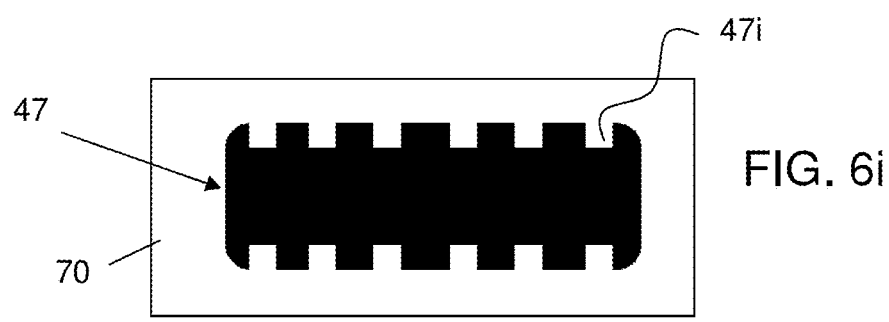
Figure 6J:
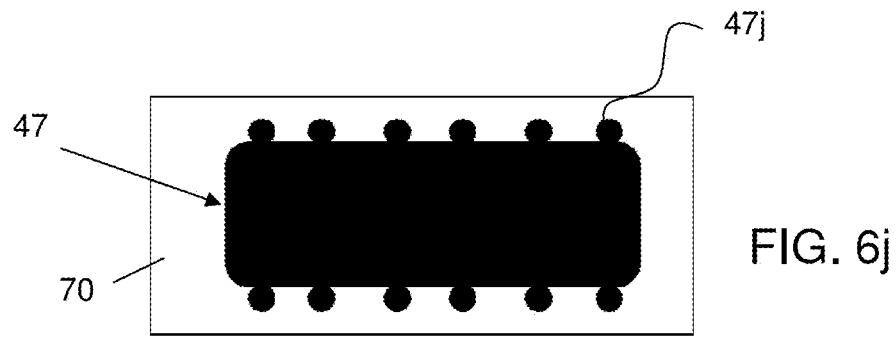

More specifically, FIG. 6b shows scalloped sidewalls 47b formed by a shape of the resist 70. FIG. 6c shows triangular notches 47c formed by a shape of the resist 70. FIG. 6d shows triangular rivets 47d formed by a shape of the resist 70. FIG. 6e shows inverted triangular rivets 47e formed by a shape of the resist 70. FIG. 6f shows triangular bumps 47f formed by a shape of the resist 70. FIG. 6g shows circular notches 47g formed by a shape of the resist 70. FIG. 6h shows circular bumps 47h formed by a shape of the resist 70. FIG. 6i shows square rivets 47i formed by a shape of the resist 70. FIG. 6j shows circular rivets 476j formed by a shape of the resist 70. In each of the embodiments shown in FIGS. 6b-6j, the features can have a spacing therebetween of about 0.5 microns, with a height or depth (depending on the features) of about 0.5 microns; although other dimensions are also contemplated by the present invention.

Figure 7:
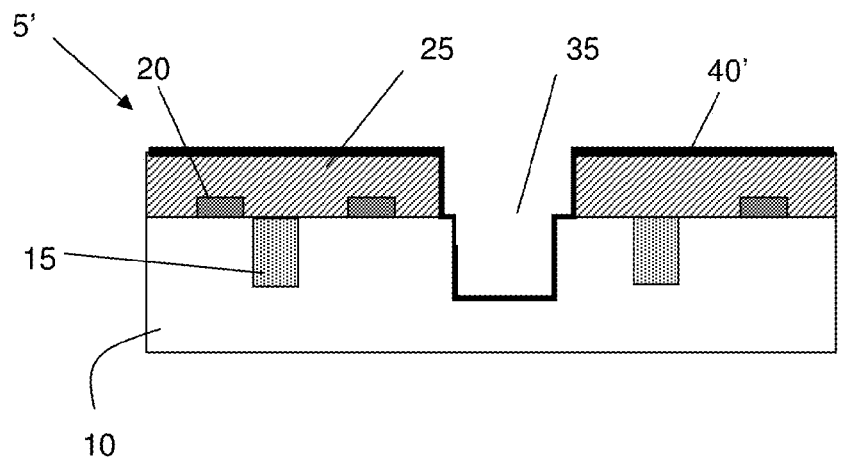
FIGS. 7-9 show alternative processing steps and respective structures in accordance with aspects of the present invention.
Figure 8:
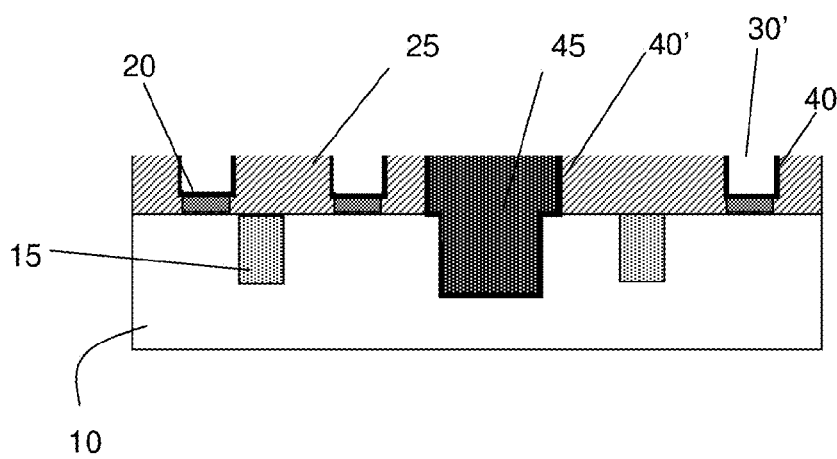
Figure 9:
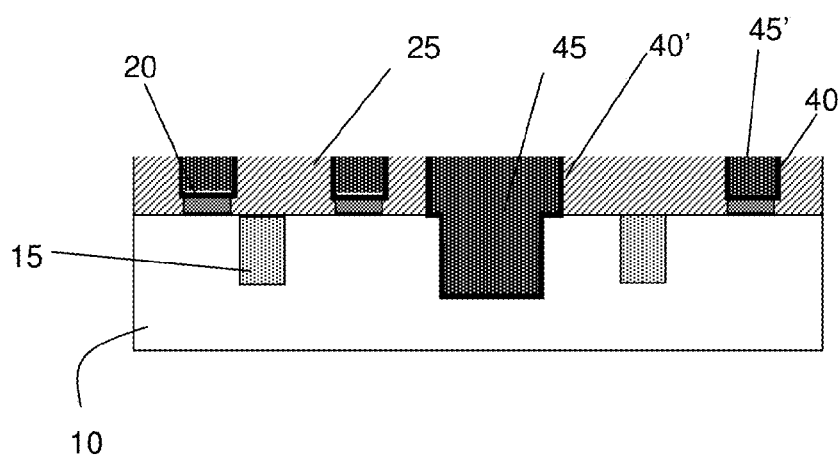

FIGS. 7-9 show additional structures and respective processing steps in accordance with alternative aspects of the present invention. Specifically, FIG. 7 shows an intermediate structure 5' with a liner 40' formed over the dielectric material 25 and within the via 35. In embodiments, the via 35 is formed prior to opening any vias in the dielectric material 25, to expose the devices 20. The via 35 can be formed in the manner described above, using conventional lithography and etching processes.

In embodiments, after formation of the via 35, the liner 40' is formed on all exposed surfaces, including the exposed surfaces of the substrate 10 within the via 35. In embodiments, the liner 40' is Hemispherical Silicon Grain (HSG) deposited using a CVD process. In embodiments, the HSG deposition process has a very low nucleation rate for Si grains, which results in a low density of silicon growth. Thus, in turn, results in a "bumpy" or rough sidewall structure of the via 35. The liner 40' can be deposited to a thickness of about 0.5 microns, with a diameter of the bumps being of about the same dimension.

In FIG. 8, material 45 is deposited in the via 35. In embodiments, the material 45 can be, for example, tungsten. The HSG liner 40' that was deposited on the upper surface of the dielectric 25 as well as any residual material 45 can be removed using, e.g., CMP. The vias 30' are then formed in the dielectric 25, exposing the devices 20. The vias 30' can be formed in any conventional manner, as already described herein. The liner 40 is then deposited in the vias 30', to act as a barrier layer as already described herein. The liner 40 can be, for example, titanium, titanium tungsten (TiW) or alloys thereof, or TiN, to name a few materials. The liner 40 can be formed in the manner already described herein.

In FIG. 9, material 45' is formed within the vias 30'. The material 45' can be, for example, tungsten. In embodiments, as described above, the liner 40 will protect the exposed dielectric material and/or devices 20 from damage during the deposition of the material 45'. The processes will continue in the same manner as described with reference to FIG. 5.

Figure 10:
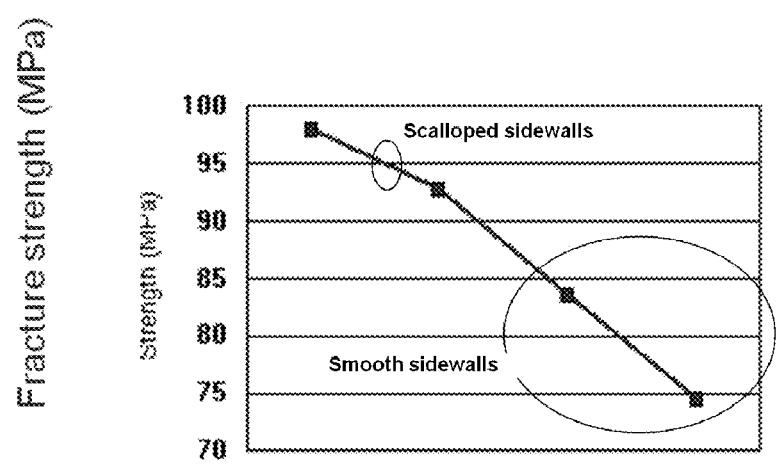
FIG. 10 shows the effect of sidewall roughness on fracture strength in accordance with aspects of the present invention.

FIG. 10 shows the effect of sidewall roughness on fracture strength in accordance with aspects of the present invention. In the graph of FIG. 10, the y-axis is representative of strength of the wafer (substrate), as measured in MPa. As shown in the graph of FIG. 10, a substrate with a TSV having roughness (e.g., scalloped features) exhibits a greater strength (e.g., on the order of about 95 MPa) than a substrate with a smooth sidewall TSV (e.g., on the order of about 74-83 MPa).

Figure 11:
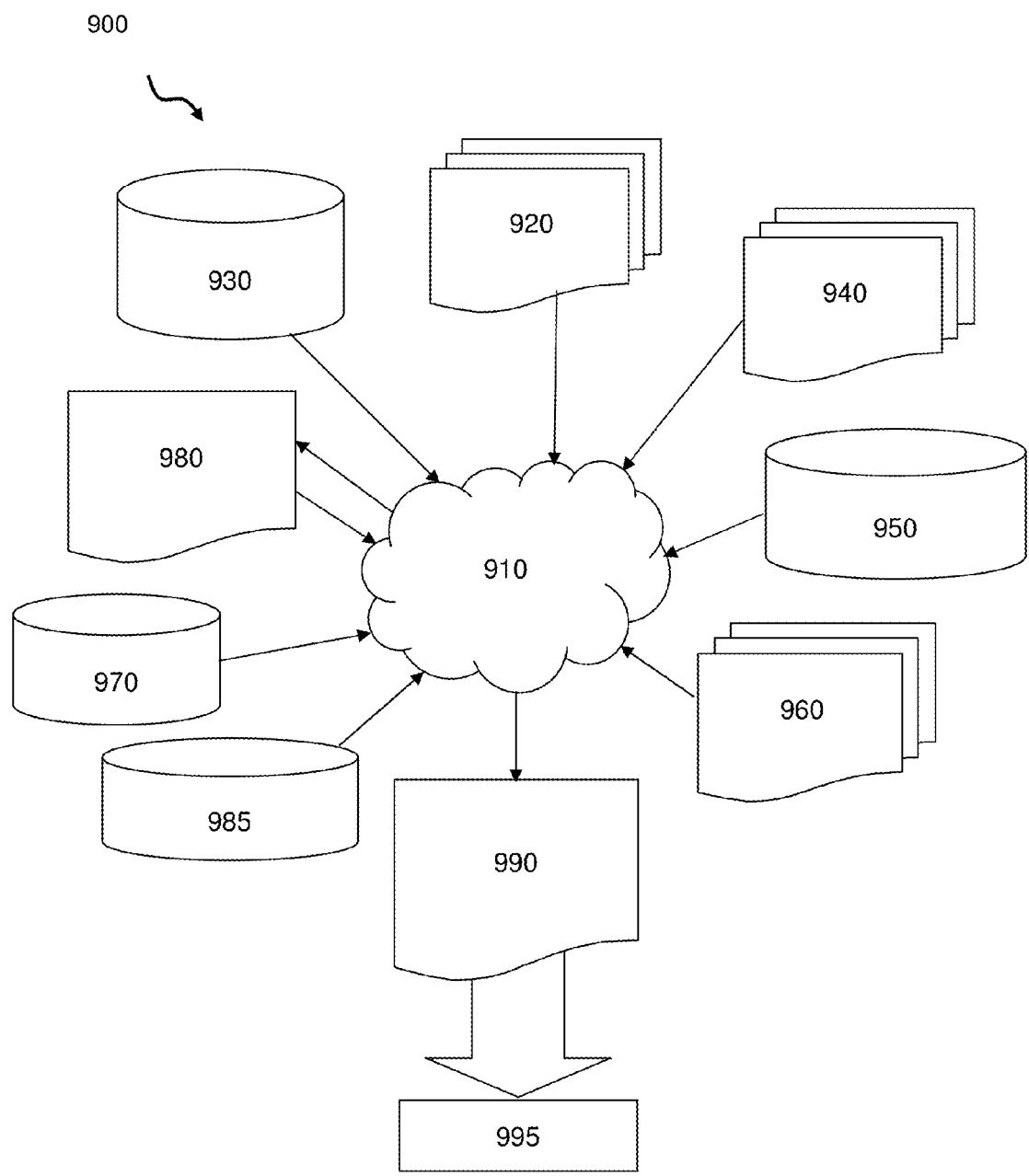
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2-5, 6a-6j and 7-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-5, 6a-6j and 7-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-5, 6a-6j and 7-9 and to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-5, 6a-6j and 7-9. In one embodiment, design structure 990 may comprise a compiled, executable HDL simulation model that functionally simulates the devices shown in FIGS. 2-5, 6a-6j and 7-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-5, 6a-6j and 7-9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming a via in a substrate;
   roughening a sidewall of the via by depositing Hemispherical Silicon Grain (HSG) within the via;
   depositing tungsten within the via using a chemical vapor deposition process with a $WF_6$ chemistry; and
   removing a backside of the substrate to form a through via with a roughened sidewall structure,
   wherein the HSG is deposited in the via prior to the depositing the tungsten within the via.

2. The method of claim 1, further comprising:
   forming a via in a dielectric contact layer, which exposes a device formed on the substrate; and
   lining the via in the dielectric contact layer, prior to the deposition of a material in the via in the dielectric contact layer, to protect the dielectric contact layer during the deposition of the material.

3. The method of claim 2, wherein the lining in the via in the dielectric contact layer is formed by a sputtering deposition process.

4. The method of claim 2, further comprising the deposition of the material in the via in the dielectric contact layer, wherein the material is tungsten.

5. The method of claim 1, wherein the via is formed by an etching process which includes forming a resist with a pattern that further contributes to the formation of the roughened sidewall structure.

6. The method of claim 1, wherein:
   the substrate is a semiconductor based substrate; and
   the through via is a through silicon via.

7. A method comprising:
   forming a resist pattern over a substrate, the resist pattern having a predetermined shape;
   etching a via in the substrate through the predetermined shape to form a roughened sidewall structure of the via corresponding to the predetermined shape;
   depositing a Hemispherical Silicon Grain (HSG) in the via to form additional roughness on sidewalls of the substrate in the via;
   depositing tungsten within the via using a chemical vapor deposition process employing a $WF_6$ chemistry, wherein the HSG is deposited prior to the depositing the tungsten; and
   removing a backside of the substrate to form a through via with the roughened sidewall structure.

8. The method of claim 7, further comprising:
forming a via in a dielectric contact layer, which exposes a device formed on the substrate; and
lining the via in the dielectric contact layer.

9. The method of claim 8, wherein the lining in the via in the dielectric contact layer is formed by a sputtering deposition process.

10. The method of claim 7, further comprising depositing the tungsten on the HSG.

11. The method of claim 7, wherein the depositing the tungsten comprises filling the via in the substrate with the tungsten.

\* \* \* \* \*